United States Patent
Alessio Verni et al.

(10) Patent No.: US 12,435,417 B2
(45) Date of Patent: Oct. 7, 2025

(54) METHODS AND SYSTEMS FOR FORMING A LAYER COMPRISING VANADIUM AND OXYGEN

(71) Applicant: ASM IP Holding B.V., Almere (NL)

(72) Inventors: Giuseppe Alessio Verni, Jodoigne (BE); Ren-Jie Chang, Leuven (BE); Qi Xie, Wilsele (BE); Charles Dezelah, Helsinki (FI)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/680,903

(22) Filed: Feb. 25, 2022

(65) Prior Publication Data

US 2022/0282374 A1  Sep. 8, 2022

Related U.S. Application Data

(60) Provisional application No. 63/155,382, filed on Mar. 2, 2021.

(51) Int. Cl.
*C23C 16/455* (2006.01)

(52) U.S. Cl.
CPC .. *C23C 16/45553* (2013.01); *C23C 16/45527* (2013.01); *C23C 16/45565* (2013.01)

(58) Field of Classification Search
CPC ......... H01L 27/11556; H01L 27/11582; H01L 21/0228; H01L 21/28194; H01L 21/0251; H01L 21/28562; H01L 21/76229; H01L 21/76227; H01L 21/76224; Y10S 977/89; C23C 16/45525; C23C 16/45544; C23C 16/45553

USPC .......................................................... 438/622
See application file for complete search history.

(56) References Cited

U.S. PATENT DOCUMENTS

| | | | |
|---|---|---|---|
| 4,300,149 | A | 11/1981 | Howard et al. |
| 4,621,277 | A | 11/1986 | Ito |
| 6,319,766 | B1 | 11/2001 | Bakli et al. |
| 6,623,799 | B1 | 9/2003 | Lee |
| 6,720,262 | B2 | 4/2004 | Koh |
| 6,759,081 | B2 | 7/2004 | Huganen |
| 7,622,369 | B1 | 11/2009 | Lee |
| 7,651,959 | B2 | 1/2010 | Fukazawa |
| 8,557,712 | B1 | 10/2013 | Antonelli et al. |
| 9,029,272 | B1 | 5/2015 | Nakano |
| 9,685,371 | B2 | 6/2017 | Zope et al. |

(Continued)

FOREIGN PATENT DOCUMENTS

| | | | |
|---|---|---|---|
| CN | 102127372 | * | 7/2011 |
| DE | 102020120899 | * | 6/2021 |

(Continued)

OTHER PUBLICATIONS

Wen-Jen Lee et al., Coatings 8(2018), 431, 1-11 (Year: 2018).*

(Continued)

*Primary Examiner* — Tabassom Tadayyon Eslami
(74) *Attorney, Agent, or Firm* — Snell & Wilmer L.L.P.

(57) ABSTRACT

Disclosed are methods and systems for depositing layers comprising vanadium and oxygen. The layers are formed onto a surface of a substrate. The deposition process may be a cyclical deposition process. Exemplary structures in which the layers may be incorporated include field effect transistors, VNAND cells, metal-insulator-metal (MIM) structures, and DRAM capacitors.

17 Claims, 8 Drawing Sheets

(56) References Cited

U.S. PATENT DOCUMENTS

| | | |
|---|---|---|
| 9,812,320 B1 | 11/2017 | Pore |
| 9,887,082 B1 | 2/2018 | Pore |
| 10,094,035 B1 | 10/2018 | Graham |
| 10,177,025 B2 | 1/2019 | Pore |
| 10,388,513 B1 | 8/2019 | Blanquart |
| 10,395,919 B2 | 8/2019 | Masaru |
| 10,460,932 B2 | 10/2019 | Van Aerde |
| 10,580,645 B2 | 3/2020 | Ueda |
| 11,295,980 B2 | 4/2022 | Zope |
| 11,447,864 B2 | 9/2022 | Fluit |
| 11,501,968 B2 | 11/2022 | Pierreux |
| 11,527,403 B2 | 12/2022 | Salmi |
| 2002/0060363 A1 | 5/2002 | Xi et al. |
| 2004/0224504 A1 | 11/2004 | Gadgil |
| 2005/0260357 A1 | 11/2005 | Olsen et al. |
| 2009/0011145 A1 | 1/2009 | Yun |
| 2009/0317982 A1* | 12/2009 | Li ............... C23C 16/45544 257/E21.24 |
| 2014/0124361 A1 | 5/2014 | Reid |
| 2015/0160149 A1 | 6/2015 | Bae et al. |
| 2016/0307905 A1* | 10/2016 | Lansalot-Matras ..... C23C 16/34 |
| 2017/0140983 A1* | 5/2017 | Leschkies ......... H01L 21/02181 |
| 2017/0309476 A1* | 10/2017 | Venkatasubramanian ................. H01L 21/02205 |
| 2017/0350012 A1 | 12/2017 | Moon et al. |
| 2018/0261502 A1 | 9/2018 | Tan |
| 2019/0351595 A1 | 11/2019 | Moreels |
| 2019/0371662 A1 | 12/2019 | Chen |
| 2020/0194304 A1 | 6/2020 | Roy et al. |
| 2020/0365447 A1 | 11/2020 | Mays et al. |
| 2020/0381275 A1 | 12/2020 | Brezoczky |
| 2021/0066080 A1 | 3/2021 | Mattinen et al. |
| 2021/0125832 A1 | 4/2021 | Bhatnagar |
| 2021/0143003 A1 | 5/2021 | Fukuda |
| 2021/0249303 A1 | 8/2021 | Blanquart |
| 2021/0257213 A1 | 8/2021 | Kikuchi |
| 2021/0285102 A1 | 9/2021 | Yoon et al. |
| 2021/0313150 A1 | 10/2021 | Kang |
| 2021/0327714 A1 | 10/2021 | Lee |
| 2021/0332479 A1 | 10/2021 | Kim |
| 2022/0005693 A1 | 1/2022 | Mizoguchi |
| 2022/0051935 A1 | 2/2022 | Kim |
| 2022/0076996 A1 | 3/2022 | Blanquart |
| 2022/0081769 A1* | 3/2022 | Chaney ............. H01L 21/02178 |
| 2022/0102190 A1 | 3/2022 | Kang |
| 2022/0108915 A1 | 4/2022 | Liu |
| 2022/0119944 A1 | 4/2022 | Yoshimoto |
| 2022/0122841 A1 | 4/2022 | Blanquart |
| 2022/0165569 A1 | 5/2022 | Liu |
| 2022/0165615 A1 | 5/2022 | Liu |
| 2022/0223411 A1 | 7/2022 | Blanquart |
| 2022/0282374 A1 | 9/2022 | Alessio Verni |
| 2022/0285146 A1 | 9/2022 | Alessio Verni |
| 2022/0285211 A1 | 9/2022 | Farm |
| 2022/0293463 A1 | 9/2022 | Vervuurt |
| 2022/0301823 A1 | 9/2022 | Yoo |
| 2022/0319834 A1 | 10/2022 | Vervuurt |
| 2022/0319855 A1 | 10/2022 | Blanquart |
| 2022/0415650 A1 | 12/2022 | Ko |
| 2023/0030566 A1 | 2/2023 | Yoo |
| 2023/0069459 A1 | 3/2023 | Haukka |
| 2023/0095086 A1 | 3/2023 | Blanquart |
| 2023/0096453 A1 | 3/2023 | Lee |
| 2023/0096838 A1 | 3/2023 | Maes |
| 2023/0098575 A1 | 3/2023 | Dezelah |
| 2023/0110980 A1 | 4/2023 | La |
| 2023/0357924 A1 | 11/2023 | Shero |

FOREIGN PATENT DOCUMENTS

| | | | |
|---|---|---|---|
| JP | 2005187943 A | | 7/2005 |
| KR | 20070023477 | * | 2/2007 |
| KR | 20070023477 A | | 2/2007 |
| WO | 2019142055 A2 | | 7/2019 |

OTHER PUBLICATIONS

Timothee Blanquart et al., RSC 3(2013), 1179-1185 (Year: 2013).*
Erik Ostreng et al., The journal of Phys. Chem., 116(2012) 19444-19450 (Year: 2012).*
I. M. Povey et al., Surface & Coating Tech. 201(2007) 9345-9348. (Year: 2007).*
Wen-Jen Lee et al.; Growth without Postannealing of Monoclinic VO2 Thin Film by Atomic Layer Deposition Using VCl4 as Precursor; Coatings; Nov. 27, 2018, 8, 431; pp. 1-11.
Galesic et al.; Formation of vanadium nitride by rapid thermal processing; Thin Solid Films 349 (1999): 14-18.
Choi et al.; Superfilling CVD of Copper Using A Catalytic Surfactant; IEEE; 2001; 3pp.
Merdrignac-Conanec et al.; Nitridation under ammonia of high surface area vanadium aerogels; Journal of Solid State Chemistry 178 (2005): 218-223.
Oyama et al.; Topotactic synthesis of vanadium nitride solid foams; Journal of materials research 8.6 (1993): 1450-1454.
Niskanen et al.; Radical-Enhanced Atomic Layer Deposition of Metallic Copper Thin Films; Journal of The Electrochemical Society, 152 (1) G25-G28 (2005).
Transition metal. Referenced from Encyclopaedia Britannica (Year: 1998); https://www.britannica.com/science/transition-metal; 11pp.
Group VIA-Chaicogens. Referenced from ChemPrime LibreTexts; https://chem.libretexts.org.@go/page/49509 (year: 2025); 2pp.
Halogen. References from Encyclopaedia Britannica (Year: 1998); https://www.britannica.com/science/halogen; 10pp.

* cited by examiner a)

b)

METHODS AND SYSTEMS FOR FORMING A LAYER COMPRISING VANADIUM AND OXYGEN

CROSS-REFERENCE TO RELATED APPLICATIONS

This application claims priority to U.S. Provisional Patent Application Ser. No. 63/155,382 filed Mar. 2, 2021 titled METHODS AND SYSTEMS FOR FORMING A LAYER COMPRISING VANADIUM AND OXYGEN, the disclosure of which is hereby incorporated by reference in its entirety.

FIELD OF INVENTION

The present disclosure generally relates to the field of semiconductor processing methods and systems, and to the field integrated circuit manufacture. In particular, methods and systems suitable for forming layers comprising a vanadium and oxygen are disclosed.

BACKGROUND OF THE DISCLOSURE

The scaling of semiconductor devices, such as, for example, complementary metal-oxide-semiconductor (CMOS) devices, has led to significant improvements in speed and density of integrated circuits. However, conventional device scaling techniques face significant challenges for future technology nodes. In particular, with miniaturization of wiring pitch of large scale integration devices, void-free filling of high aspect ratio gaps or trenches (e.g. trenches having an aspect ratio of three or higher) becomes increasingly challenging due to limitations of existing deposition processes. Therefore, there is a need for processes that efficiently fill high aspect ratio features, e.g. gaps such as trenches on semiconductor substrates, for example in the context of logic and/or memory devices. There is a particular need for processes that efficiently fill high aspect ratio features with vanadium oxide-containing materials that adequately withstand subsequent chemical mechanical polishing (CMP) steps and etching processes.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of depositing a material comprising vanadium and oxygen, to structures and devices formed using such methods, and to apparatus for performing the methods and/or for forming the structures and/or devices. The layers may be used in a variety of applications.

Thus, provided is a method for filling a gap. The method comprises introducing a substrate provided with a gap into a reactor chamber. The gap comprises a proximal part and a distal part. The distal part comprises a distal surface. The proximal part comprises a proximal surface. The method further comprises executing a plurality of deposition cycles. A deposition cycle comprises a precursor pulse and a reactant pulse. The precursor pulse comprises introducing a vanadium precursor into the reactor chamber. The reactant pulse comprises introducing an oxygen reactant into the reactor chamber. Thus, a vanadium oxide containing material is selectively deposited on the distal surface.

In some embodiments, the vanadium precursor is selected from a vanadium halide, a vanadium oxyhalide, and an organometallic vanadium compound.

In some embodiments, the vanadium precursor comprises a vanadium halide.

In some embodiments, the vanadium halide comprises vanadium chloride.

In some embodiments, the vanadium chloride comprises vanadium(IV) chloride.

In some embodiments, the vanadium precursor comprises a vanadium beta-diketonate.

In some embodiments, the oxygen reactant is selected from $O_2$, $H_2O$, and $H_2O_2$.

In some embodiments, the oxygen reactant comprises $H_2O$.

In some embodiments, subsequent deposition cycles are separated by an inter-deposition cycle purge.

In some embodiments, the precursor pulse and the reactant pulse are separated by an intra deposition cycle purge.

In some embodiments, the substrate comprises a monocrystalline silicon wafer.

In some embodiments, the precursor pulse has a duration of at least 0.01 s to at most 1.0 s.

In some embodiments, the intra-cycle purge has a duration of at least 1 s to at most 10 s.

In some embodiments, the oxygen reactant pulse has a duration of at least 0.1 s to at most 1.0 s.

In some embodiments, the inter-cycle purge has a duration of at least 2 s to at most 50 s.

In some embodiments, the reaction chamber is maintained at a pressure of at least 0.1 Torr to at most 10 Torr.

In some embodiments, the inter-cycle purge lasts for a pre-determined inter-cycle purge time. It shall be understood that the reaction chamber is maintained at a pre-determined reaction chamber pressure. Also, the pre-determined inter-cycle purge time multiplied with the pre-determined reaction chamber pressure equals from at least 2 s·Torr to at most 200 s·Torr.

Further described herein is a semiconductor device that comprises a layer that is formed by means of a method according to the present disclosure.

Further described herein is a system that comprises a reaction chamber, a precursor gas source, a reactant gas source, and a controller. The precursor gas source comprises a vanadium precursor. The reactant gas source comprises an oxygen reactant. The controller is configured to control gas flow into the reaction chamber to form a layer on the substrate by means of a method as described herein.

In some embodiments, the system further comprises a showerhead injector. It shall be understood that the showerhead injector is arranged for sequentially providing the vanadium precursor and the oxygen reactant to the reaction chamber.

These and other embodiments will become readily apparent to those skilled in the art from the following detailed description of certain embodiments having reference to the attached figures. The invention is not limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 8:
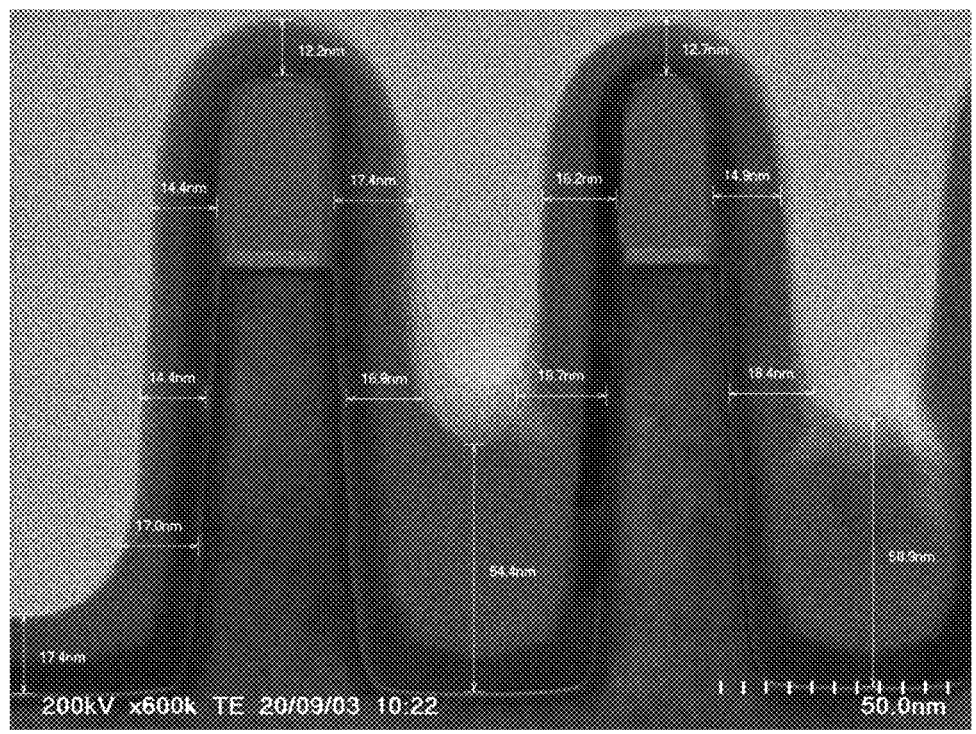
Figure 8:
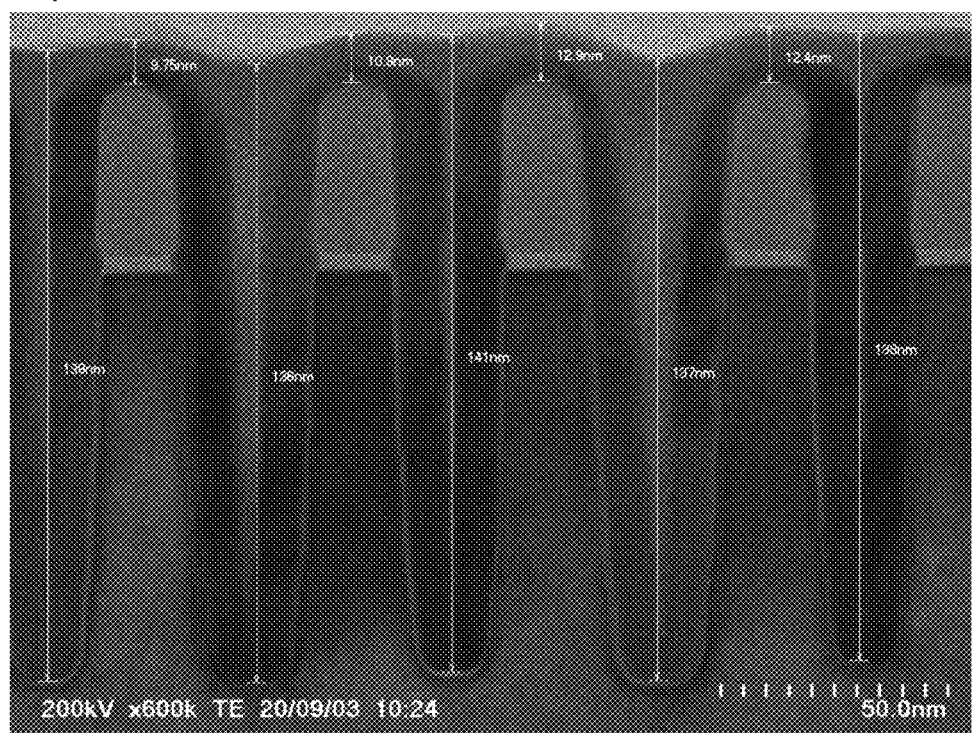

FIG. 8 panels a) and b) shows scanning electron micrographs on high aspect ratio test structures on which a vanadium oxide layer was deposited using an embodiment of a method as disclosed herein.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas. Exemplary seal gasses include noble gasses, nitrogen, and the like. In some cases, the term "precursor" can refer to a compound that participates in the chemical reaction that produces another compound, and particularly to a compound that constitutes a film matrix or a main skeleton of a film; the term "reactant" can be used interchangeably with the term precursor.

As used herein, the term "substrate" can refer to any underlying material or materials that can be used to form, or upon which, a device, a circuit, or a film can be formed by means of a method according to an embodiment of the present disclosure. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of example, a substrate can include bulk semiconductor material and an insulating or dielectric material layer overlying at least a portion of the bulk semiconductor material.

As used herein, the term "film" and/or "layer" can refer to any continuous or non-continuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may comprise, or may consist at least partially of, a plurality of dispersed atoms on a surface of a substrate and/or may be or may become embedded in a substrate and/or may be or may become embedded in a device manufactured on that substrate. A film or layer may comprise material or a layer with pinholes and/or isolated islands. A film or layer may be at least partially continuous. A film or layer may be patterned, e.g. subdivided, and may be comprised in a plurality of semiconductor devices. A film or layer may be selectively grown on some parts of a substrate, and not on others.

As used herein, a "structure" can be or can include a substrate as described herein. Structures can include one or more layers overlying the substrate, such as one or more layers formed according to a method as described herein. Device portions can be or include structures.

The term "deposition process" as used herein can refer to the introduction of precursors (and/or reactants) into a reaction chamber to deposit a layer over a substrate. "Cyclical deposition processes" are examples of "deposition processes."

The term "cyclic deposition process" or "cyclical deposition process" can refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component.

The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/reactive gas(es), and purge (e.g., inert carrier) gas(es).

Generally, for ALD processes, during each cycle, a precursor is introduced into a reaction chamber and is chemisorbed onto a deposition surface (e.g., a substrate surface that can include a previously deposited material from a previous ALD cycle or other material) and forming about a monolayer or sub-monolayer of material that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

As used herein, the term "purge" may refer to a procedure in which an inert or substantially inert gas is provided to a reaction chamber in between two pulses of gasses that react with each other. For example, a purge, e.g. using a noble gas, may be provided between a precursor pulse and a reactant pulse, thus avoiding or at least minimizing gas phase interactions between the precursor and the reactant. It shall be understood that a purge can be effected either in time or in space, or both. For example in the case of temporal purges, a purge step can be used e.g. in the temporal sequence of providing a first precursor to a reaction chamber, providing a purge gas to the reaction chamber, and providing a second precursor to the reaction chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied.

As used herein, a "precursor" includes a gas or a material that can become gaseous and that can be represented by a chemical formula that includes an element which may be incorporated during a deposition process as described herein.

The term "oxygen reactant" can refer to a gas or a material that can become gaseous and that can be represented by a chemical formula that includes oxygen. In some cases, the chemical formula includes oxygen and hydrogen.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like.

As used herein, the term "comprising" indicates that certain features are included, but that it does not exclude the presence of other features, as long as they do not render the claim or embodiment unworkable. In some embodiments, the term "comprising" includes "consisting". As used herein, the term "consisting" indicates that no further features are present in the apparatus/method/product apart from the ones following said wording. When the term "consisting" is used referring to a chemical compound, it indicates that the chemical compound only contains the components which are listed.

In this disclosure, the term "filling capability" refers to a capability of filling a gap substantially without voids (e.g., no void having a size of approximately 5 nm or greater in diameter) and seams (e.g., no seam having a length of approximately 5 nm or greater), wherein seamless/void-less bottom-up growth of a layer is observed. The growth at a bottom of a gap may be at least approximately 1.5 times faster than growth on sidewalls of the gap and on a top surface having the gap. This disclosure concerns films having filling capability, i.e., films that preferentially grow bottom-up in a gap.

In this disclosure, a recess between adjacent protruding structures and any other recess pattern may be referred to as a "gap." That is, a gap may refer to any recess pattern including a hole/via. A gap can have, in some embodiments, a width of about 20 nm to about 100 nm, and typically about 30 nm to about 50 nm. When a trench has a length that is substantially the same as its width, it can be referred to as a hole or a via. Holes or vias typically have a width of about 20 nm to about 100 nm. In some embodiments, a trench has a depth of about 30 nm to about 100 nm, and typically of about 40 nm to about 60 nm. In some embodiments, a gap has an aspect ratio of about 2 to about 10, and typically of about 2 to about 5. The dimensions of the gap may vary depending on process conditions, film composition, intended application, etc.

As used herein, the term "height" may refer to the extent of a gap in a plane perpendicular to the surface of the substrate that comprises the gap in question.

As used herein, the term "width" may refer to the extent of a gap in a direction in a plane parallel to the surface of the substrate that comprises the gap in question.

As used herein, the term "length" may refer to the extent of a gap in a direction in a plane parallel to the surface of the substrate that comprises the gap in question. The directions in which the "width" and the "length" are measured are mutually perpendicular. It shall be understood that all dimensions, including length, width, and height of a structure, can be measured using routine techniques such as scanning tunneling electron microscopy (STEM).

In this disclosure, any defined meanings do not necessarily exclude ordinary and customary meanings, in some embodiments.

Disclosed herein is a method for filling a gap. The method comprises introducing a substrate provided with a gap into a reaction chamber. Exemplary gaps include recesses, contact holes, vias, trenches, and the like. The gap comprises a distal part and a proximal part. The distal part comprises a distal surface. The proximal part comprises a proximal surface. It shall be understood that the gap does not necessarily have to be oriented vertically, but can extend in a horizontal direction. It shall be understood that the proximal part of the gap is the part of the gap that is closest to the substrate surface in which the gap forms a recess, and the distal part of the gap is the part of the gap that is most distant from that surface.

The method further comprises executing one or more deposition cycles. In some embodiments, the method comprises executing a plurality of deposition cycles. A deposition cycle comprises a precursor pulse and a reactant pulse. The precursor pulse comprises introducing a vanadium precursor into the reactor chamber. The reactant pulse comprises introducing an oxygen reactant into the reactor chamber. Thus, a vanadium oxide containing material is selectively deposited on the distal surface. The present methods are highly advantageous, e.g. when it is desirable to fill a gap or recess with vanadium oxide, which is a useful compound semiconducting material. In addition, vanadium oxide can be useful as a phase change material. Thus, it can be used, for example, in a phase change memory device. Furthermore, the presently disclosed methods can advantageously result in vanadium oxide layers containing little to no carbon impurities.

In some embodiments, a layer thus formed has a step coverage equal to or greater than 50%, or greater than 80%, or greater than 90%, or greater than 100%, or greater than 110%, or greater than 150%, or greater than 200%, in/on structures having aspect ratios (height/width) of more than about 2, more than about 5, more than about 10, more than about 25, more than about 50, more than about 100, or between about 10 and 100 or about 5 to about 25. It shall be understood that the term "step coverage" refers to the growth rate of a layer on a distal surface of a recess, divided by the growth rate of that layer on a proximal surface of the recess, and expressed as a percentage. In other words, it shall be understood that the vanadium oxide is preferentially deposited at the distal side/bottom of the gap feature. In other words, more metal oxide is deposited in a distal/lower/deeper portion of the gap feature compared to a proximal/upper portion of the gap feature. It shall be understood that a distal portion of the gap feature refers to a portion of the gap feature which is relatively far removed from a substrate's surface, and that the proximal portion of a gap feature refers to a part of the gap feature which is closer to the substrate's surface compared to the distal/lower/deeper portion of the gap feature.

It shall be understood that the presently disclosed methods are preferably thermal. In other words, preferably no plasma is generated while the presently disclosed methods are executed.

As an example of a use case, a vanadium oxide gap fill layer formed in accordance with an embodiment of the present disclosure can be used as a dielectric filling layer above self-aligned contacts.

By means of a method as disclosed herein, a layer having a desired thickness can be deposited by choosing a suitable amount of deposition cycles. For example, and in some embodiments, the presently described methods can comprise depositing a layer having a thickness of at least 0.1 nm to at most 1 nm, or of at least 1 nm to at most 5 nm, or of at least 5 nm to at most 10 nm, or of at least 10 nm to at most 20 nm, or of at least 20 nm to at most 50 nm, or of at least 50 nm to at most 100 nm. Thus, a method as described herein may comprise executing a suitable amount of deposition cycles. In some embodiments, only one deposition cycle is executed. In some embodiments, the presently described methods comprise executing from at least 2 to at most 5 deposition cycles, or from at least 5 to at most 10 deposition cycles, or from at least 10 to at most 20 deposition cycles, or from at least 20 to at most 50 deposition cycles, or from at least 50 to at most 100 deposition cycles, or from at least 100 to at most 200 deposition cycles, or from at least 200 to at most 500 deposition cycles, or from at least 500 to at most 1000 deposition cycles, or from at least 1000 to at most 2000 deposition cycles, or from at least 2000 to at most 5000 deposition cycles, or from at least 5000 to at most 10000 deposition cycles.

Any suitable vanadium precursor can be used in the present methods. In some embodiments, the vanadium precursor is selected from a vanadium halide, a vanadium oxyhalide, and an organometallic vanadium compound. It shall be understood that the term "organometallic vanadium compound" refers to a vanadium-containing compound that comprises vanadium and carbon. For example, an "organometallic vanadium compound" may comprise a vanadium-carbon bond.

The vanadium precursor can, in some embodiments, comprise a vanadium halide. Suitable vanadium halides include vanadium chloride, vanadium fluoride, vanadium bromide, or vanadium iodide. In some embodiments, the vanadium precursor comprises vanadium chloride, such as vanadium(IV) chloride.

The vanadium halide can include only vanadium and one or more halogens—e.g., vanadium tetrachloride or the like. A vanadium oxyhalide can be selected from one or more of vanadium oxyhalides, such as one or more of a vanadium oxyfluoride, a vanadium oxychloride, a vanadium oxybromide, and a vanadium oxyiodide. The vanadium oxyhalide can include only vanadium, oxygen, and one or more halides. By way of examples, the vanadium halide and oxyhalide can be selected from the group consisting of include one or more of $VCl_4$, $VBr_4$, $VI_4$, $VOCl_4$, $VOBr_3$, $VOI_3$ (respectively named as vanadium tetrachloride, vanadium tetrabromide, vanadium tetraiodide, vanadiumoxytrichloride, vanadiumoxytribromide, and vanadiumoxytriiodide). For example, the vanadium precursor may comprise $VCl_4$.

Use of vanadium halide precursors can be advantageous relative to methods that use other precursors, such as metalorganic vanadium precursors, because the vanadium halide precursors can be relatively inexpensive, can result in vanadium layers with lower concentrations of impurities, such as carbon, and/or processes that use such precursors can be more controllable—compared to processes that use metalorganic or other vanadium precursors. In addition, processes that use vanadium halide may be easier to scale up, compared to methods that use organometallic vanadium precursors. In some embodiments, the use of halide-free precursors can be advantageous, e.g. when it is desirable to minimize or avoid etching of exposed dielectric layers, e.g. high-k dielectric layers.

The vanadium precursor can, in some embodiments, comprises a vanadium beta diketonate. Exemplary vanadium beta-diketonate compounds include $VO(acac)_2$, $VO(thd)_2$, $V(acac)_3$, $V(thd)_3$ (respectively named as oxobis(2,4-pentanedionato)vanadium(IV), oxobis(2,2,6,6-tetramethyl-3,5-heptanedionato)vanadium(IV), tris(2,4-pentanedionato)vanadium(IV), and tris(2,2,6,6-tetramethyl-3,5-heptanedionato)vanadium(IV)), and the like.

The vanadium comprised in the vanadium precursor can have any suitable oxidation state. For example, and in some embodiments, the vanadium comprised in the vanadium precursor can have an oxidation state of II, III, IV; or a mixture thereof. In some embodiments, the vanadium precursor comprises one or more compounds selected from vanadium (II) chloride, vanadium (III) chloride, vanadium (IV) chloride; and a mixture thereof.

In some embodiments, the vanadium precursor comprises one or more of a vanadium halide, a vanadium oxyhalide, and a vanadium organometallic compound. Thus, in some embodiments, the vanadium precursor comprises a vanadium halide. In some embodiments, the vanadium precursor comprises a vanadium oxyhalide. In some embodiments, the vanadium precursor comprises vanadium oxychloride. In some embodiments, the vanadium precursor comprises a vanadium alkoxide. In some embodiments, the vanadium precursor comprises Vanadium(V) oxytriethoxide. In some embodiments, the vanadium precursor comprises Vanadium (V) oxytripropoxide. In some embodiments, the vanadium precursor comprises a vanadium organometallic compound. In some embodiments, the vanadium precursor comprises $VCl_4$. In some embodiments, the vanadium precursor comprises a vanadium beta-diketonate. In some embodiments, the vanadium precursor comprises Vanadium(III) acetylacetonate.

The vanadium precursor can, in some embodiments, include one or more of a vanadium halide, a vanadium oxyhalide, a vanadium beta-diketonate compound, a vanadium cyclopentadienyl compound, a vanadium alkoxide compound, a vanadium dialkylamido compound, or the like.

Exemplary vanadium dialkylamido compounds include $V(NMe_2)_4$, $V(NEt_2)_4$, and $V(NEtMe)_4$, (respectively named as tetrakis(dimethylamido)vanadium(IV), tetrakis(diethylamido)vanadium(IV), and tetrakis(ethylmethylamido)vanadium(IV)).

Exemplary vanadium alkoxide compounds include V(OMe)$_4$, V(OEt)$_4$, V(OiPr)$_4$, V(OtBu)$_4$, VO(OMe)$_3$, VO(OEt)$_3$, VO(OiPr)$_3$, and VO(OtBu)$_3$, (respectively named as tetrakis(methoxy)vanadium(IV), tetrakis(ethoxy)vanadium(IV), tetrakis(isopropoxy)vanadium(IV), tetrakis(t-butoxy)vanadium(IV), oxotris(methoxy)vanadium(IV), oxotris(ethoxy)vanadium(IV), oxotris(isopropoxy)vanadium(IV), and, oxotris(t-butoxy)vanadium(IV)). Additional vanadium alkoxide compounds include variations of these compounds, where other alkoxy ligands are used.

Exemplary vanadium cyclopentadienyl compounds include VCp$_2$Cl$_2$, VCp$_2$, VCp$_2$(CO)$_4$, (respectively named as bischlorobis(cyclopentadienyl)vanadium(IV), bis(cyclopentadienyl)vanadium(II), and cyclopentadienylvanadium tetracarbonyl)). Additional exemplary vanadium cyclopentadienyl compounds include variations of these compounds, where Cp is either unsubstituted or bearing one or more alkyl groups, e.g., MeCp, EtCp, iPrCp, and the like.

Suitable oxygen reactants include an oxygen-containing compound or gas mixture. For example, the oxygen reactant can, in some embodiments, comprise a gas or vapor selected from O$_2$, H$_2$O, and H$_2$O$_2$. In some embodiments, the oxygen reactant comprises an oxygen and hydrogen-containing compound. In some embodiments, the oxygen reactant comprises H$_2$O.

Subsequent deposition cycles can, in some embodiments, be separated by an inter deposition cycle purge. In some embodiments, the duration of the inter-deposition cycle purge is from at least 0.025 s to at most 2.0 s, or from at least 0.05 s to at most 0.8 s, or from at least 0.1 s to at most 0.4 s, or from at least 0.2 s to at most 0.3 s.

The metal precursor pulse and the oxygen reactant pulse can, in some embodiments, be separated by an intra deposition cycle purge. In some embodiments, the duration of the intra deposition cycle purge is from at least 0.025 s to at most 2.0 s, or from at least 0.05 s to at most 0.8 s, or from at least 0.1 s to at most 0.4 s, or from at least 0.2 s to at most 0.3 s.

In some embodiments, the precursor pulse has a duration of at least 0.01 s to at most 1.0 s. In some embodiments, the precursor pulse lasts from at least 0.25 s to at most 4.0 s, or from at least 0.5 s to at most 2.0 s, or from at least 1.0 s to at most 1.5 s. In some embodiments, the oxygen reactant pulse lasts from at least 0.25 s to at most 4.0 s, or from at least 0.5 s to at most 2.0 s, or from at least 1.0 s to at most 1.5 s.

In some embodiments, the intra-cycle purge has a duration of at least 1 s to at most 10 s, or of at least 0.1 s to at most 0.2 s, or of at least 0.2 s to at most 0.5 s, or of at least 0.5 s to at most 1 s, or of at least 1 s to at most 2 s, or of at least 2 s to at most 5 s, or of at least 5 s to at most 10 s, or of at least 10 s to at most 20 s, or of at least 20 s to at most 50 s.

In some embodiments, the oxygen reactant pulse has a duration of at least 0.1 s to at most 1.0 s, or of at least 0.1 s to at most 0.2 s, or of at least 0.2 s to at most 0.5 s, or of at least 0.5 s to at most 1 s, or of at least 1 s to at most 2 s, or of at least 2 s to at most 5 s, or of at least 5 s to at most 10 s, or of at least 10 s to at most 20 s, or of at least 20 s to at most 50 s.

In some embodiments, the inter-cycle purge has a duration of at least 2 s to at most 50 s, or of at least 0.1 s to at most 0.2 s, or of at least 0.2 s to at most 0.5 s, or of at least 0.5 s to at most 1 s, or of at least 1 s to at most 2 s, or of at least 2 s to at most 5 s, or of at least 5 s to at most 10 s, or of at least 10 s to at most 20 s, or of at least 20 s to at most 50 s.

The reaction chamber is, in some embodiments, and while executing a method as described herein, maintained at a pressure of at least 0.1 Torr to at most 10 Torr. In some embodiments, the presently described methods are carried out at a pressure of less than 760 Torr or of at least 0.2 Torr to at most 760 Torr, of at least 1 Torr to at most 100 Torr, or of at least 1 Torr to at most 10 Torr. In some embodiments, the vanadium oxide containing layer is deposited at a pressure of at most 10.0 Torr, or at a pressure of at most 5.0 Torr, or at a pressure of at most 3.0 Torr, or at a pressure of at most 2.0 Torr, or at a pressure of at most 1.0 Torr, or at a pressure of at most 0.1 Torr, or at a pressure of at most $10^{-2}$ Torr, or at a pressure of at most $10^{-3}$ Torr, or at a pressure of at most $10^{-4}$ Torr, or at a pressure of at most $10^{-5}$ Torr, or at a pressure of at least 0.1 Torr to at most 10 Torr, or at a pressure of at least 0.2 Torr to at most 5 Torr, or at a pressure of at least 0.5 Torr to at most 2.0 Torr.

The present methods are, in some embodiments, carried out at a substrate temperature of less than 800° C., or of at least 400° C. to at most 500° C., or of at least 300° C. to at most 400° C., or of at least 200° C. to at most 300° C., or of at least 100° C. to at most 200° C., or of at least 150° C. to at most 500° C., or of at least 200° C. to at most 400° C., or of at least 250° C. to at most 350° C. In other words, and in some embodiments, the substrate is maintained at one of the aforementioned temperatures while executing a method as described herein.

Suitable gapfill behavior can be obtained, in some embodiments, by simultaneously controlling reaction chamber pressure and one or more purge times within a pre-determined range. In particular, and in some embodiments, the product of a purge time and reaction chamber pressure can be controlled within a pre-determined range in order to achieve a suitable gapfill behavior. Thus, and in some embodiments, the inter-cycle purge lasts for a pre-determined inter-cycle purge time, the reaction chamber is maintained at a pre-determined reaction chamber pressure, and the pre-determined inter-cycle purge time multiplied with the pre-determined reaction chamber pressure equals from at least 2 s·Torr to at most 200 s·Torr, or from at least 5 s·Torr to at most 150 s·Torr, for example of 10 s·Torr, 20 s·Torr, 50 s·Torr, or 100 s·Torr.

In the following paragraph, process conditions are given for a reaction chamber volume of 1 liter and for 300 mm wafers. The skilled person understands that these values can be readily extended to other reaction chamber volumes and wafer sizes.

In some embodiments, the vanadium precursor is entrained by a carrier gas. In some embodiments, the carrier gas is provided at a flow rate of at least 0.2 to at most 2.0 slpm, or from at least 0.3 to at most 1.5 slpm, or from at least 0.4 to at most 1.0 slpm, or from at least 0.5 to at most 0.7 slpm. In some embodiments, N$_2$ is used as a carrier gas. In some embodiments, a noble gas is used as a carrier gas. Suitable noble gasses include He, Ne, Ar, and Xe.

In some embodiments, the vanadium content of a layer formed by means of a method as described herein is from at least 1.0 atomic percent to at most 99.0 atomic percent, or from at least 3.0 atomic percent to at most 97.0 atomic percent, or from at least 5.0 atomic percent to at most 95.0 atomic percent, or from at least 10.0 atomic percent to at most 90.0 atomic percent, or from at least 20.0 atomic percent to at most 80.0 atomic percent, or from at least 30.0 atomic percent to at most 70.0 atomic percent, or from at least 40.0 atomic percent to at most 60.0 atomic percent.

In some embodiments, the oxygen content of the layer formed by means of a method as described herein is from at least 1.0 atomic percent to at most 70.0 atomic percent, or from at least 3.0 atomic percent to at most 65.0 atomic percent, or from at least 5.0 atomic percent to at most 60.0 atomic percent, or from at least 10.0 atomic percent to at most 50.0 atomic percent, or from at least 15.0 atomic percent to at most 50.0 atomic percent, or from at least 20.0 atomic percent to at most 40.0 atomic percent, or from at least 25.0 atomic percent to at most 35.0 atomic percent.

A monocrystalline silicon wafer may be a suitable substrate. Other substrates may be suitable well, e.g. monocrystalline germanium wafers, gallium arsenide wafers, quartz, sapphire, glass, steel, aluminum, silicon-on-insulator substrates, plastics, etc.

Further provided is a semiconductor device comprising a layer which is formed by means of a method as described herein. In some embodiments, the semiconductor device can be or form part of, for example, a MOSFET, e.g. a pMOSFET or an nMOSFET.

Further described herein is a wire partially or wholly lined with a layer comprising vanadium and oxygen. Advantageously, the layer comprising vanadium and oxygen is formed by means of a method as described herein. In some embodiments, the wire comprises copper. In some embodiments, the wire comprises tungsten. In some embodiments, the wire comprises a core that consists of, or that substantially consists of, copper and/or tungsten. In some embodiments, the wire comprises molybdenum. In some embodiments, the wire comprises ruthenium. In some embodiments, the wire comprises silver. In some embodiments, the wire comprises gold. In some embodiments, the wire comprises platinum. In some embodiments, the wire comprises palladium. Advantageously, the layer is formed according to a method for forming a layer on a on a substrate in a reaction chamber as described herein. It shall be understood that the term "wire" may refer to an interconnect or to a plurality of interconnects, which are commonly encountered in integrated circuits.

Further described is a system that comprises a reaction chamber, a precursor gas source, an oxygen reactant gas source, and a controller. The precursor gas source comprises a vanadium precursor. The vanadium precursor comprises vanadium. The oxygen reactant gas source comprises an oxygen reactant. The oxygen reactant comprises oxygen. The controller is configured to control gas flow into the reaction chamber to form a layer overlying a surface of a substrate. The layer comprises vanadium and oxygen. It shall be understood that the layer is deposited by means of a method as described herein.

In some embodiments, the system further comprises a showerhead injector. The showerhead injector is arranged for sequentially providing the vanadium precursor and the oxygen reactant to the reaction chamber.

Figure 1:
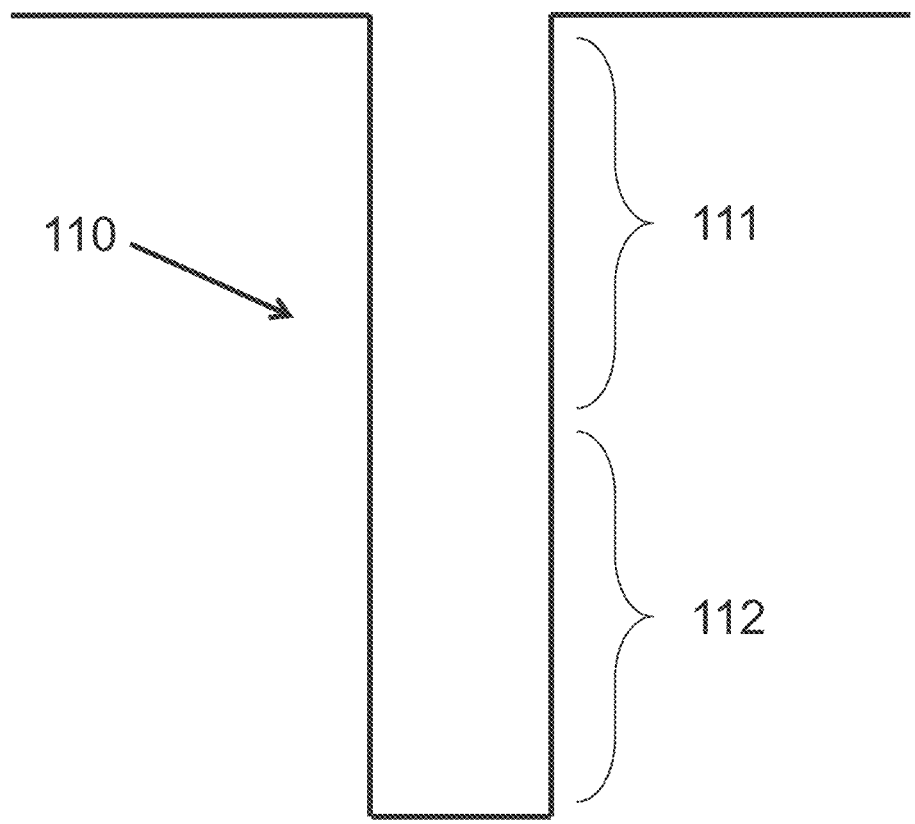
FIG. 1 shows a schematic representation of a substrate (100) comprising a gap feature (110).

FIG. 1 shows a schematic representation of a substrate (100) comprising a gap feature (110). The gap feature (110) comprises a proximal part (111) and a distal part (112). The proximal part (111) comprises a proximal surface, and the distal part (112) comprises a distal surface. The present methods result in preferential growth of vanadium oxide on the distal surface compared to the proximal surface, thereby resulting in a bottom-up filling of the gap.

Figure 2:
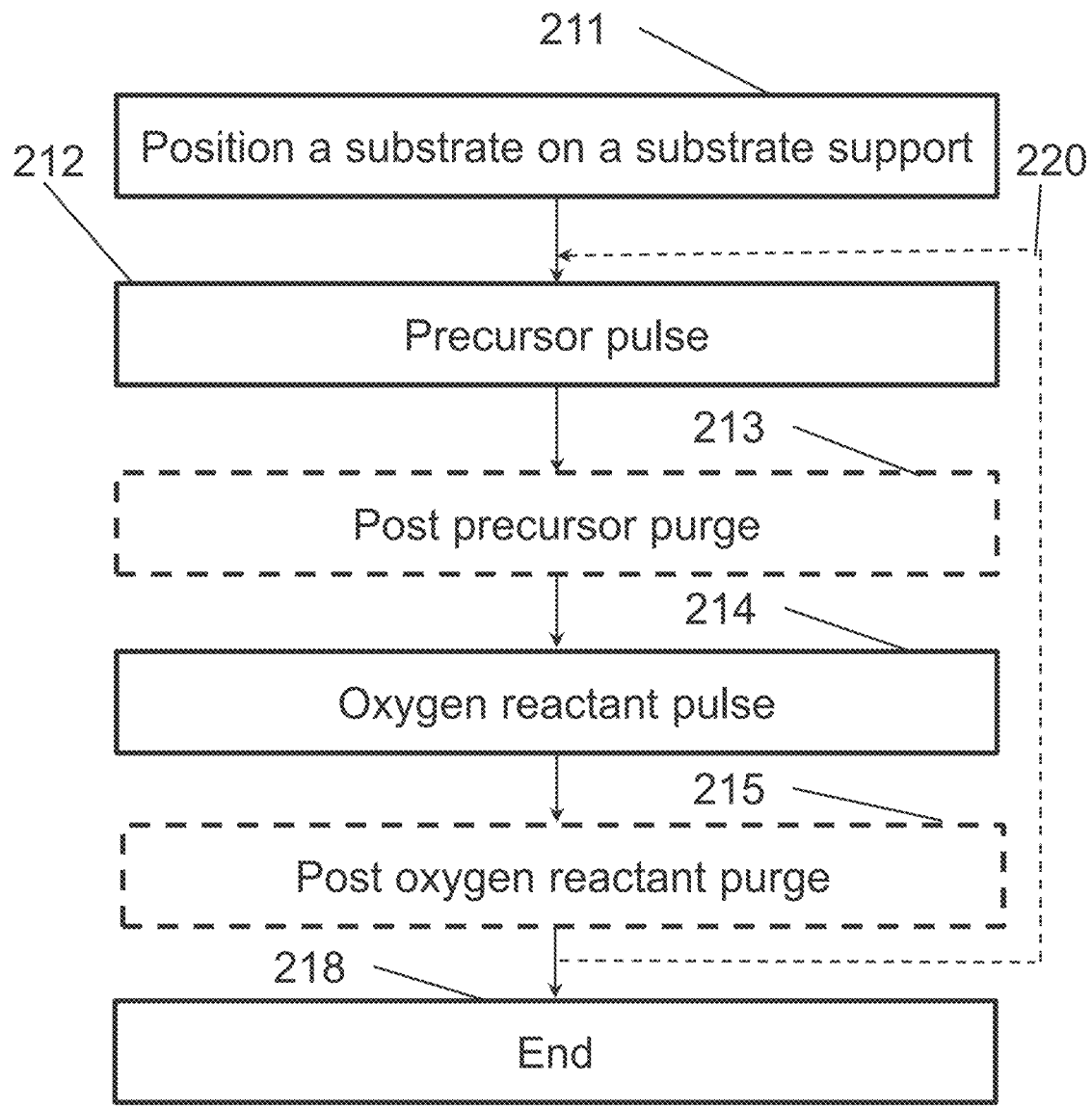
FIG. 2 shows a schematic representation of an embodiment of a method as described herein.

FIG. 2 shows a schematic representation of an embodiment of a method as described herein. The method can be used to fill a gap comprised in an integrated circuit. The method comprises a step (211) of positioning a substrate on a substrate support. Then, the method comprises executing a precursor pulse (212) in which a vanadium precursor is provided to the reaction chamber. Optionally, the reaction chamber is purged after the precursor pulse (212) by means of a post precursor purge (213). Alternatively, the post precursor purge (213) can comprise transporting the substrate through a purge gas curtain. Then, the method comprises executing an oxygen reactant pulse (214) in which the substrate is exposed to an oxygen reactant. Optionally, the oxygen reactant pulse (214) can be followed by a post oxygen reactant purge (215) in which the reaction chamber can be purged by means of a purge gas. Alternatively, the post oxygen reactant purge (215) can comprise transporting the substrate through a purge gas curtain. The precursor pulse (212) and the oxygen reactant pulse (214) together form a deposition cycle. Optionally, the method comprises subsequently executing a plurality of deposition cycles, i.e. optionally the method comprises repeating (220) the precursor pulse (212) and the oxygen reactant pulse (214) one or more times. Thus, a vanadium oxide layer having a pre-determined thickness is deposited. After the vanadium oxide layer has achieved a desired thickness, the method ends (218).

A method according to FIG. 2 can include heating the substrate to a desired deposition temperature within the reaction chamber. In some embodiments, a method according to FIG. 1 or 2 includes heating the substrate to a temperature of less than 800° C. For example, in some embodiments of the disclosure, heating the substrate to a deposition temperature may comprise heating the substrate to a temperature between approximately 20° C. and approximately 800° C., about 100° C. and about 500° C., about 150° C. and about 450° C., or about 200° C. and about 400° C.

In addition to controlling the temperature of the substrate, a pressure within the reaction chamber may also be regulated. For example, in some embodiments of the disclosure, the pressure within the reaction chamber during a method according to FIG. 2 may be less than 760 Torr or between 0.2 Torr and 760 Torr, about 1 Torr and 100 Torr, or about 1 Torr and 10 Torr, or less than 3 Torr, or less than 2 Torr, or less than 1 Torr.

Figure 3:
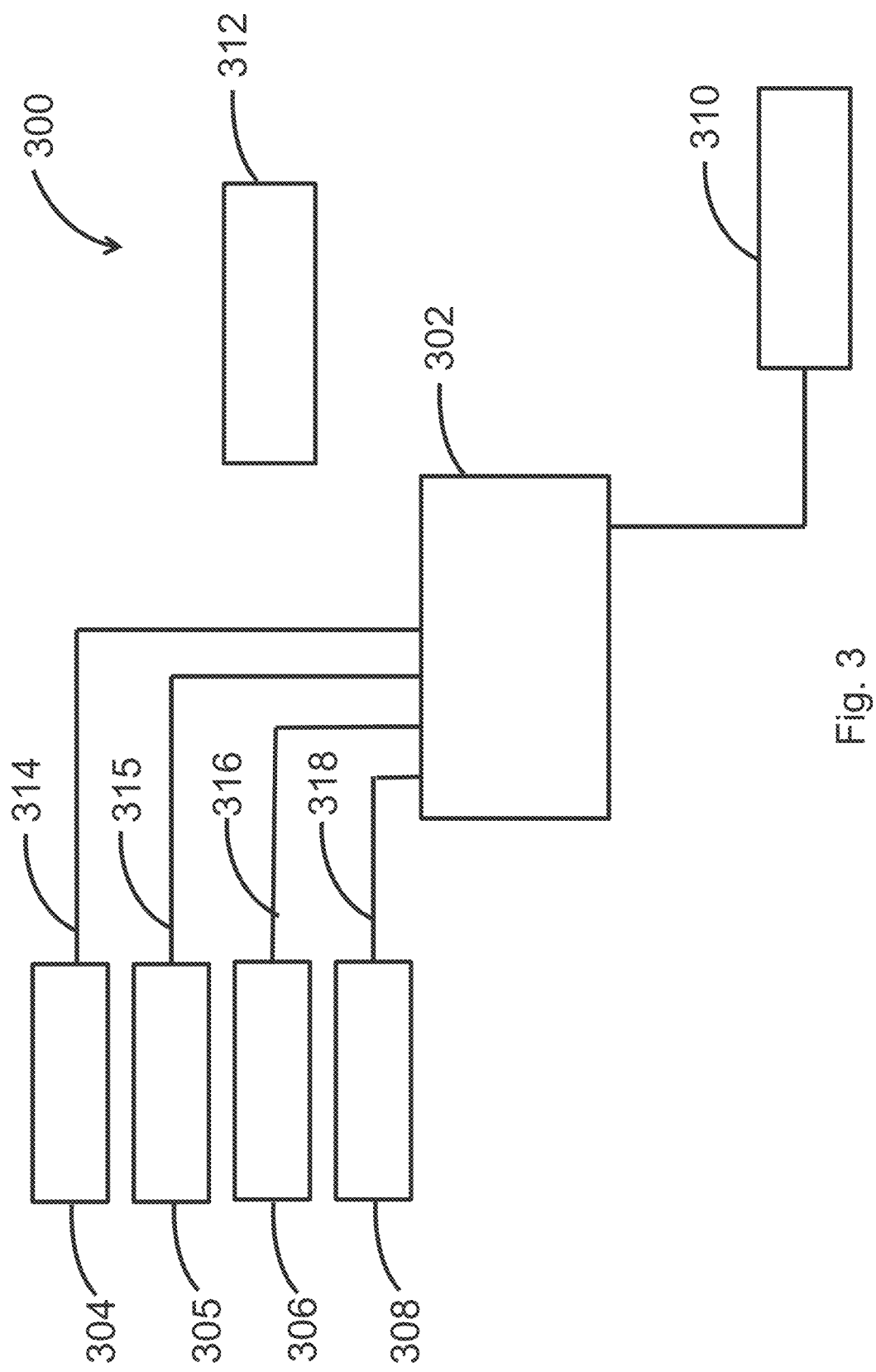
FIG. 3 illustrates a system (300) in accordance with exemplary embodiments of the disclosure.

FIG. 3 illustrates a system (300) in accordance with exemplary embodiments of the disclosure. The system (300) can be configured to perform a method as described herein and/or form a structure or device portion as described herein.

In the illustrated example, the system (300) includes one or more reaction chambers (302), a precursor gas source (304), a reactant gas source (306), a purge gas source (308), an exhaust (310), and a controller (312).

The reaction chamber (302) can include any suitable reaction chamber, such as an ALD or CVD reaction chamber.

The precursor gas source (304) can include a vessel and one or more precursors as described herein—alone or mixed with one or more carrier (e.g., noble) gases. The reactant gas source (306) can include a vessel and one or more reactants as described herein—alone or mixed with one or more carrier gases. The purge gas source (308) can include one or more inert gases as described herein. In some embodiments, the one or more inert gasses are selected from nitrogen and a noble gas. Although illustrated with four gas sources (304)-(308), the system (300) can include any suitable number of gas sources. The gas sources (304)-(308) can be coupled to the reaction chamber (302) via the lines (314)-(318), which can each include flow controllers, valves, heaters, and the like.

The exhaust (310) can include one or more vacuum pumps.

The controller (312) includes electronic circuitry and software to selectively operate valves, manifolds, heaters, pumps and other components included in the system (300). Such circuitry and components operate to introduce precursors, reactants, and purge gases from the respective sources (304)-(308). The controller (312) can control timing of gas pulse sequences, temperature of the substrate and/or reaction chamber, pressure within the reaction chamber, and various other operations to provide proper operation of the system (300). The controller (312) can include control software to electrically or pneumatically control valves to control flow of precursors, reactants and purge gases into and out of the reaction chamber (302). The controller (312) can include modules such as a software or hardware component, e.g., a FPGA or ASIC, which performs certain tasks. A module can advantageously be configured to reside on the addressable storage medium of the control system and be configured to execute one or more processes as described herein.

Other configurations of the system (300) are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into the reaction chamber (302). Further, as a schematic representation of a system, many components have been omitted for simplicity of illustration, and such components may include, for example, various valves, manifolds, purifiers, heaters, containers, vents, and/or bypasses.

During operation of the system (300), substrates, such as semiconductor wafers (not illustrated), are transferred from, e.g., a substrate handling system to the reaction chamber (302). Once the substrate(s) are transferred to the reaction chamber (302), one or more gases from the gas sources (304)-(308), such as precursors, reactants, carrier gases, and/or purge gases, are introduced into the reaction chamber (302).

Figure 4:
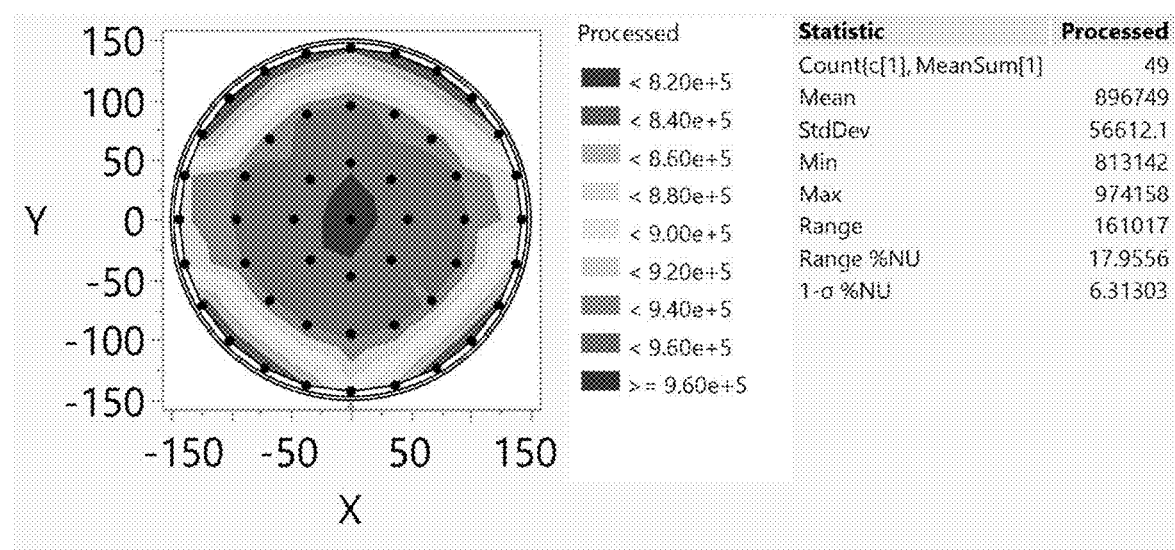
FIG. 4 shows experimental sheet resistance data.

FIG. 4 shows experimental sheet resistance data of a blanket vanadium oxide film deposited using a cyclical deposition process comprising alternating vanadium precursor pulses and oxygen reactant pulses separated by purges. The cyclical deposition process used to deposit the vanadium oxide film employs vanadium chloride, i.e. $VCl_4$, as a vanadium precursor and $H_2O$ as an oxygen reactant. The vanadium oxide film was deposited on a dielectric stack comprising a thermal silicon oxide layer covered with a hafnium oxide layer, thereby allowing to easily measure the sheet resistance of the vanadium oxide film. Excellent sheet resistivity uniformity was obtained. This layer was deposited using a vanadium precursor pulse that lasted 0.1 s, a post precursor purge that lasted 5 s, an oxygen reactant pulse that lasted 0.3 s, and an inter-cycle purge that lasted 20 seconds. The reaction chamber was maintained at a pressure of 1 Torr, and the substrate was maintained at a temperature of 300° C. The vanadium oxide film was deposited on a dielectric stack comprising thermal silicon oxide and hafnium oxide in order to improve sheet resistance measurements. A total of 350 cycles were executed, yielding a vanadium oxide film having a thickness of about 10 nm. The film's elemental composition was studied by means of x-ray photoelectron spectroscopy (XPS), and yielded 32.49 at % V, 64.42 at % O, 0.13 at % Cl, 0.28 at % C, and 2.68 at % Si. Thus, the film advantageously contains a very low amount of carbon and chlorine impurities. Root means square (RMS) roughness measured by means of atomic force microscopy (AFM) was 0.43 nm.

Figure 5:
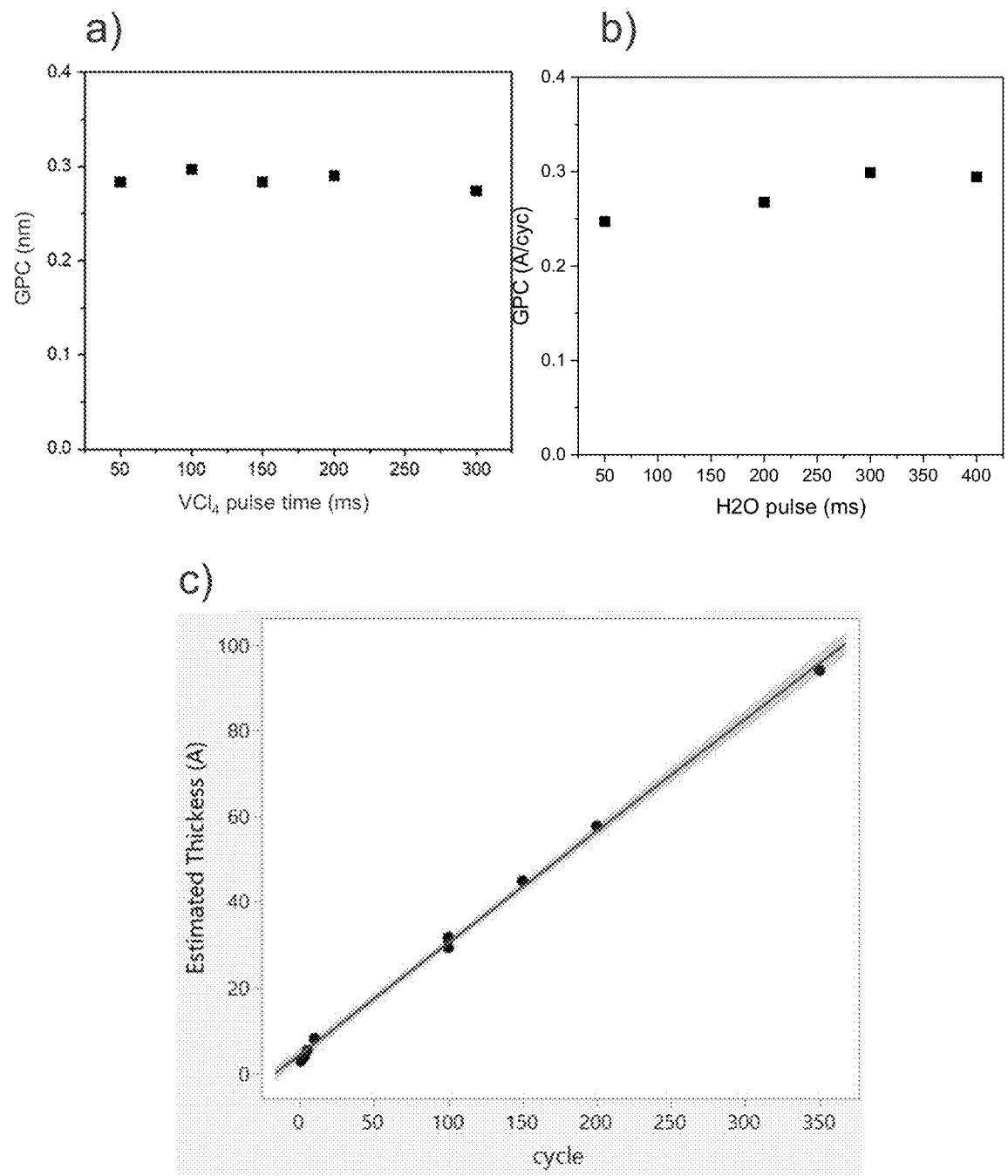
FIG. 5 shows experimental results of vanadium oxide deposition cycles performed using an embodiment of method as described herein.

FIG. 5 shows experimental results of vanadium oxide deposition cycles performed using an embodiment of method as described herein. In particular, the vanadium precursor used in this particular experiment is $VCl_4$, and the oxygen reactant used in this particular experiment is $H_2O$. Panel a) shows saturation experiments in which the vanadium oxide deposition was performed at 300° C. showing that the growth per cycle is constant irrespective of vanadium precursor pulse time, over a wide range. Panel b) shows saturation experiments performed at 300° C. showing that the growth per cycle is constant irrespective of oxygen reactant pulse time, over a wide range. Panel c) shows that the growth rate is linear from about 0 to about 350 cycles. The above-mentioned saturation and linearity experiments were performed using a $VCl_4$ pulse time of 0.1 seconds, an intra-deposition cycle purge time of 5 seconds, an oxygen reactant pulse time of 0.3 seconds, and an inter-deposition cycle purge time of 20 seconds. The process was carried out at a pressure of 1 Torr. Using such conditions, a vanadium oxide deposition process having ALD characteristics, i.e. a deposition featuring self-limiting surface reactions, can be obtained.

In a further exemplary embodiment, vanadium oxide depositions are disclosed which result in a CVD-like deposition regime. In particular, the vanadium precursor used in these experiments is $VCl_4$, and the oxygen reactant used in this particular experiment is $H_2O$. Without the invention being bound to any particular theory or mode of operation, it is believed that in the CVD-like regime, vanadium oxide growth occurs predominantly via non-self-limiting gas phase reactions. Conversely, in an ALD-like deposition regime, it is believed that the deposition occurs primarily via self-limiting surface reactions. The following set of reaction conditions resulted in a deposition that can be characterized as a CVD-like deposition regime: $VCl_4$ pulse time was 0.1 seconds, intra-deposition cycle purge time was 5 seconds, oxygen reactant pulse time was 3 seconds, and inter-deposition cycle purge time was 1 seconds. The process was carried out at a pressure of 1 Torr and at a substrate temperature of 300° C.

Figure 6:
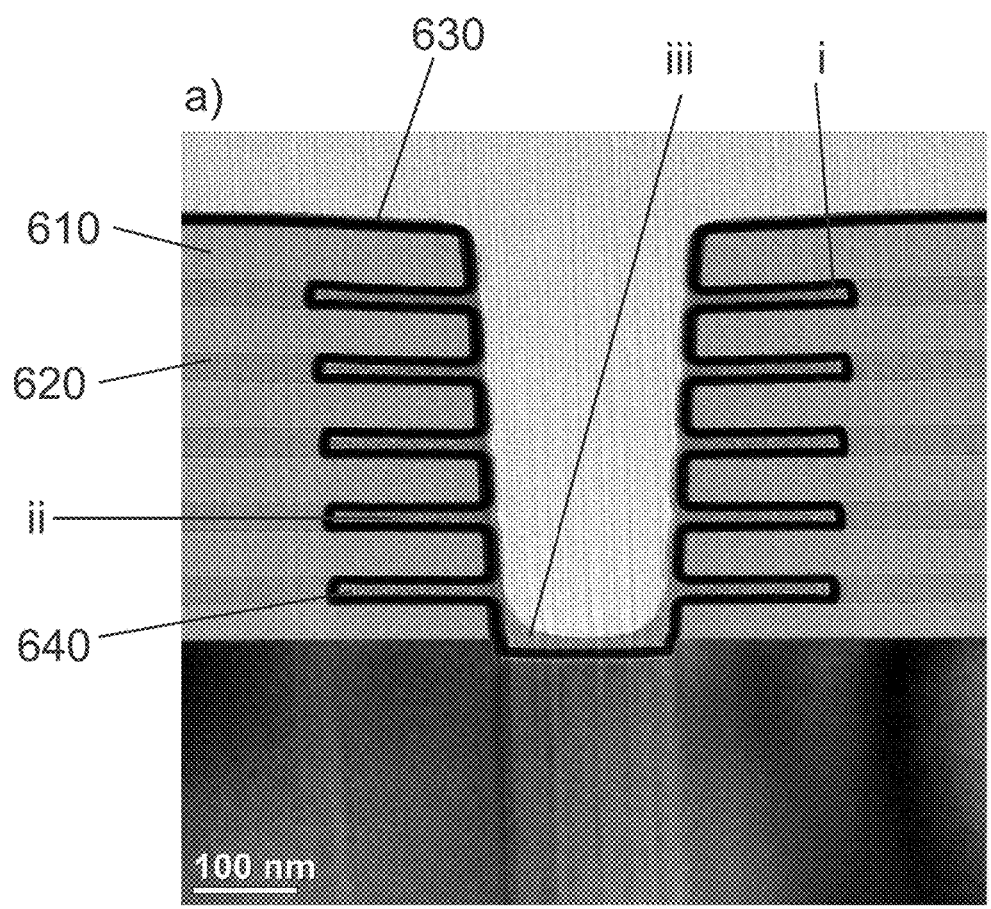
FIG. 6 shows a test structure comprising alternating silicon oxide layers (610) and silicon nitride layers (620).
Figure 6:
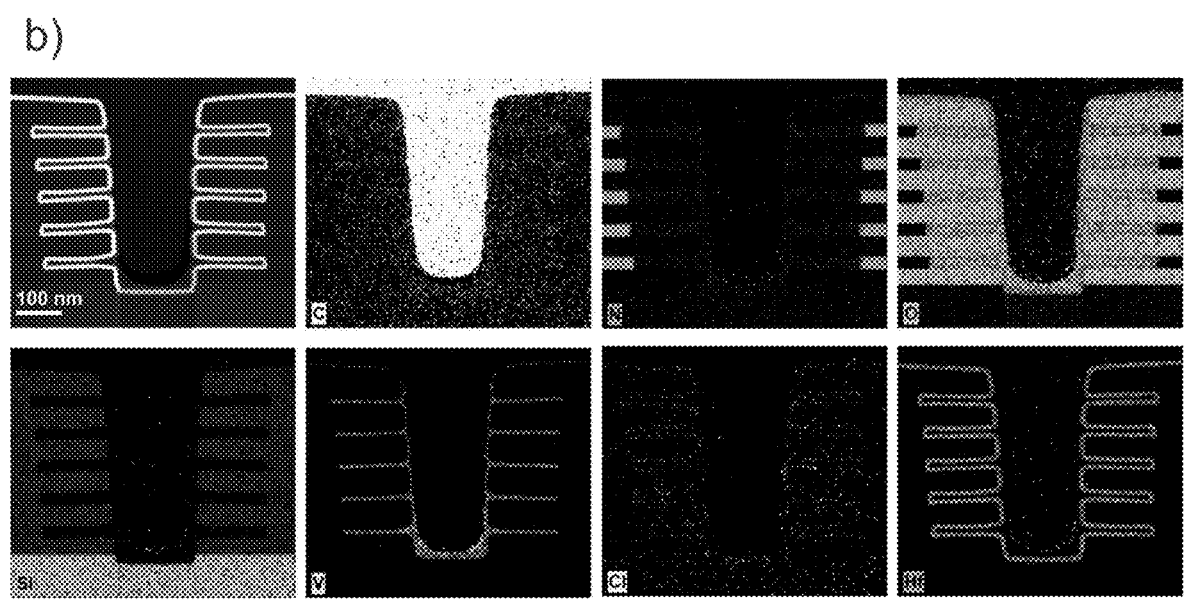

FIG. 6 shows a test structure comprising alternating silicon oxide layers (610) and silicon nitride layers (620). In particular, panel a) shows a transmission electron micrograph of the test structure, and panel b) shows elemental composition maps obtained by means of electron energy loss spectroscopy. The silicon nitride layers (620) are recessed to form horizontal gaps, i.e. cavities. A hafnium oxide layer (630) was conformally deposited on the test structure. Thus, hafnium oxide-lined cavities were formed. These cavities were filled with vanadium oxide layer (640) deposited in a CVD-like regime in accordance with an embodiment of a method as disclosed herein. In particular, hafnium oxide has a thickness of about 9 nm, and vanadium oxide was deposited with a number of cycles that was selected to obtain a 3 nm thick vanadium oxide layer on an unpatterned substrate. In this experiment, enhanced growth of vanadium oxide in the hafnium oxide-lined cavities was observed. Without the invention being bound to any particular theory or mode of operation, it is believed that residual hydrogen in the hafnium oxide-lined cavities during a precursor pulse results in CVD-type growth with an enhanced growth per cycle inside the hafnium-lined cavities, whereas outside the hafnium-lined cavities, the hydrogen is poorly retained, and an ALD-type growth occurs with a lower growth rate per cycle.

Thus, a gap can be seamlessly filled bottom-up with vanadium oxide. At the top of the wafer (position i), only 3.6 nm vanadium oxide was deposited. At the bottom of the recess from which the lateral hafnium-lined cavities start (position iii), 11 nm of vanadium oxide was deposited. The hafnium-lined cavities (location ii) are completely and seamlessly filled with vanadium oxide. Thus, it is clear that vanadium oxide is selectively deposited in gaps such recesses, trenches, cavities, and the like.

Figure 7:
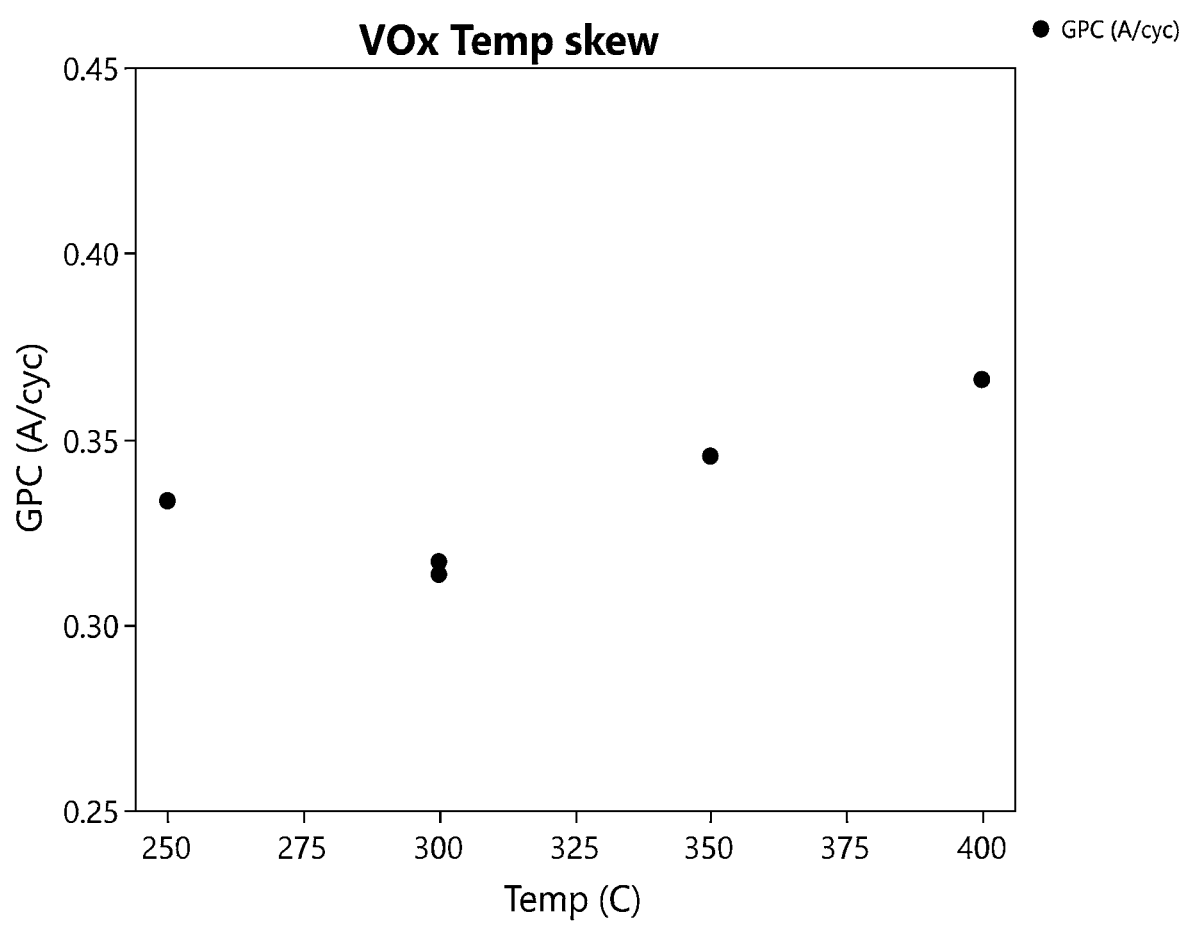
FIG. 7 shows growth per cycle (GPC) measurements as a function of substrate temperature during vanadium oxide deposition.

FIG. 7 shows growth per cycle (GPC) measurements as a function of substrate temperature during vanadium oxide deposition. $VCl_4$ was used as a vanadium precursor and $H_2O$ was used as an oxygen reactant. $VCl_4$ pulse time was 0.1 s, intra-cycle purge time was 5 s; oxygen reactant pulse time was 0.3 s, and inter-cycle purge time was 20 s. A total number of 100 deposition cycles were performed. Reactor pressure was 1 Torr. No significant growth rate per cycle (GPC) dependence on temp was observed, except for a slight increase of GPC at higher temperatures. No particle formation was observed for any of the conditions.

FIG. 8 panels a) and b) shows scanning electron micrographs on high aspect ratio test structures on which a vanadium oxide layer was deposited using an embodiment of a method as disclosed herein. The reaction conditions used were the same as those for the layers of FIG. 6, except that a total of 440 cycles were carried out, for a target thickness of 15 nm was used.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method for filling a gap by a thermal process, the method comprising:
   introducing a substrate provided with a gap into a reactor chamber, the gap comprising a gap surface comprising a proximal part and a distal part, the distal part comprising a distal surface within the gap, the proximal part comprising a proximal surface within the gap, the distal surface and the proximal surface comprising the same material;
   executing a plurality of deposition cycles, a deposition cycle comprising a precursor pulse and a reactant pulse, wherein:
      the precursor pulse comprises introducing a gaseous vanadium precursor into the reactor chamber; and,
      the reactant pulse comprises introducing a gaseous oxygen reactant into the reactor chamber;
   thereby spatially selectively depositing a vanadium oxide containing material on the distal surface relative to the proximal surface, wherein the step coverage of the vanadium oxide containing material is greater than 150%,
   wherein the vanadium precursor chemisorbs onto the gap surface during the precursor pulse of a first deposition cycle, and
   wherein a temperature within the reaction chamber during the step of executing a plurality of deposition cycles is at least 400° C.

2. The method according to claim 1 wherein the vanadium precursor comprises a vanadium oxyhalide.

3. The method according to claim 1 wherein the vanadium precursor comprises vanadium (V) oxytripropoxide or vanadium (V) oxytriethoxide.

4. The method according to claim 1, wherein the vanadium precursor comprises a vanadium alkoxide, a vanadium cyclopentadienyl compound, or a vanadium dialkylamido compound.

5. The method according to claim 1, wherein the vanadium precursor comprises vanadium (IV) chloride.

6. The method according to claim 1 wherein the vanadium precursor comprises a vanadium beta-diketonate.

7. The method according to claim 1, wherein the oxygen reactant is consists of one or more of $O_2$ and $H_2O_2$.

8. The method according to claim 1, wherein the oxygen reactant is consists of $O_2$.

9. The method according to claim 1, wherein a pressure within the reaction chamber during the step of executing a plurality of deposition cycles is at most 0.1 Torr.

10. The method according to claim 9 wherein the inter-deposition cycle purge has a duration of at least 2 s to at most 50 s.

11. The method according to claim 9 wherein the inter-deposition cycle purge lasts for a pre-determined inter-cycle purge time from at least 2 s to at most 10 s, wherein the reaction chamber is maintained at a pre-determined reaction chamber pressure, and wherein the pre-determined inter-cycle purge time multiplied with the pre-determined reaction chamber pressure equals from at least 2 s·Torr to at most 200 s·Torr.

12. The method according to claim 1, wherein the step of executing the plurality of deposition cycles immediately follows the step of introducing the substrate into the reactor chamber.

13. The method according to claim 1 wherein the gap surface comprises a monocrystalline silicon.

14. The method according to claim 1 wherein the precursor pulse has a duration of at least 0.01 s to at most 1.0 s.

15. The method according to claim 1, wherein the step coverage of the vanadium oxide containing material is greater than 200%.

16. The method according to claim 1, wherein the gap comprises a sidewall and a bottom, and wherein the distal part and the proximal part are on the sidewall of the gap.

17. A method for filling a gap comprising:
   introducing a substrate provided with a gap into a reactor chamber, the gap comprising a proximal part and a distal part, the distal part comprising a distal surface within the gap, the proximal part comprising a proximal surface within the gap, the distal surface and the proximal surface comprising the same material;
   executing a plurality of deposition cycles, a deposition cycle comprising a precursor pulse and a reactant pulse, wherein:
      the precursor pulse comprises introducing a gaseous vanadium precursor into the reactor chamber; and,
      the reactant pulse comprises introducing a gaseous oxygen reactant into the reactor chamber;
   thereby spatially selectively depositing a vanadium oxide containing material on the distal surface relative to the proximal surface, wherein the step coverage of the vanadium oxide containing material is greater than 150%, wherein the inter-deposition cycle purge lasts for a pre-determined inter-cycle purge time, wherein the reaction chamber is maintained at a pressure of at least 0.1 Torr to at most 10 Torr, and wherein the pre-determined inter-cycle purge time multiplied with the pressure equals from at least 2 s·Torr to at most 150 s·Torr,
wherein a temperature within the reaction chamber during the step of executing a plurality of deposition cycles is at least 400° C.

* * * * *

UNITED STATES PATENT AND TRADEMARK OFFICE
CERTIFICATE OF CORRECTION

PATENT NO. : 12,435,417 B2
APPLICATION NO. : 17/680903
DATED : October 7, 2025
INVENTOR(S) : Giuseppe Alessio Verni et al.

Page 1 of 1

It is certified that error appears in the above-identified patent and that said Letters Patent is hereby corrected as shown below:

In the Claims

Column 16, Claim 7, Line 15, please delete the word "is."

Column 16, Claim 8, Line 17, please delete the word "is."

Signed and Sealed this
Twenty-third Day of December, 2025

John A. Squires
*Director of the United States Patent and Trademark Office*